United States Patent
Tien et al.

(10) Patent No.: US 11,997,813 B2
(45) Date of Patent: May 28, 2024

(54) WATERPROOF ELECTRONIC DEVICE

(71) Applicant: PEGATRON CORPORATION, Taipei (TW)

(72) Inventors: Hsin-Min Tien, Taipei (TW); Cheng-Lun Chiang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 18/174,561

(22) Filed: Feb. 24, 2023

(65) Prior Publication Data

US 2023/0345656 A1 Oct. 26, 2023

(30) Foreign Application Priority Data

Apr. 22, 2022 (TW) .................... 111115394

(51) Int. Cl.
| | | |
|---|---|---|
| *G06F 1/16* | (2006.01) | |
| *H05K 5/00* | (2006.01) | |
| *H05K 5/02* | (2006.01) | |
| *H05K 5/06* | (2006.01) | |
| *H05K 7/00* | (2006.01) | |

(52) U.S. Cl.
CPC ........... *H05K 5/065* (2013.01); *H05K 5/0214* (2022.08)

(58) Field of Classification Search
CPC ................. H05K 5/065; H05K 5/0214; H05K 5/0213–0216; H05K 5/06–069
See application file for complete search history.

(56) References Cited

U.S. PATENT DOCUMENTS

| | | | | |
|---|---|---|---|---|
| 5,583,742 A * | 12/1996 | Noda | ..................... | G06F 1/1626 |
| | | | | 361/679.21 |
| 9,161,467 B2 * | 10/2015 | Murakata | ............ | H01M 50/271 |
| 9,519,314 B2 * | 12/2016 | English | ................ | G06F 1/1656 |
| 9,659,466 B1 * | 5/2017 | Chen | ..................... | G07G 1/0018 |
| 11,614,773 B2 * | 3/2023 | Lee | ........................ | H02G 15/10 |
| | | | | 361/679.01 |
| 2008/0291641 A1 * | 11/2008 | Sheng | ................... | G06F 1/1658 |
| | | | | 361/726 |
| 2009/0219676 A1 * | 9/2009 | Murakata | ............ | H01M 50/262 |
| | | | | 361/679.01 |

(Continued)

FOREIGN PATENT DOCUMENTS

| | | |
|---|---|---|
| CN | 110087422 | 8/2019 |
| CN | 215345381 | 12/2021 |
| CN | 216895963 | 7/2022 |

*Primary Examiner* — Anthony M Haughton
(74) *Attorney, Agent, or Firm* — J.C. PATENTS

(57) ABSTRACT

A waterproof electronic device including a body, a one-way valve, and a cover is provided. The body has a first hole, which penetrates the body and communicates with an external environment, and a chamber. The one-way valve disposed on an inner surface of the body communicates with the first hole. The one-way valve has a main runner, multiple shunt runners, and multiple stopper blocks. Each stopper block is located between the main runner and a corresponding shunt runner. The cover disposed on the one-way valve has a second hole communicated with the one-way valve and the chamber. When a fluid enters the one-way valve from the second hole, the fluid is discharged from the body through the first hole. When the fluid enters the one-way valve from the first hole, the fluid generates a resistance in the one-way valve.

9 Claims, 5 Drawing Sheets

(56) References Cited

U.S. PATENT DOCUMENTS

| | | | | |
|---|---|---|---|---|
| 2011/0110022 A1* | 5/2011 | Kumagai | ................ | H04M 1/18 |
| | | | | 361/679.01 |
| 2012/0314354 A1* | 12/2012 | Rayner | ................ | G06F 1/1633 |
| | | | | 361/679.01 |
| 2016/0305562 A1* | 10/2016 | Kagomoto | .............. | F16K 17/04 |

* cited by examiner

WATERPROOF ELECTRONIC DEVICE

CROSS-REFERENCE TO RELATED APPLICATION

This application claims the priority benefit of Taiwan application serial no. 111115394, filed on Apr. 22, 2022. The entirety of the above-mentioned patent application is hereby incorporated by reference herein and made a part of this specification.

BACKGROUND

Technical Field

The disclosure relates to an electronic device, and in particular to a waterproof electronic device.

Description of Related Art

Existing electronic products enclose electronic components in outer cases, so as to achieve basic protection. However, there are gaps in the existing outer cases, which cause the dust or moisture in the environment to enter the outer cases from the gaps easily, hence causing the short circuit or damage of the electronic components.

For this reason, the existing electronic products mostly adopt closed structures to seal the gaps of the outer cases, thereby isolating the dust and the moisture in the environment, so as to protect the electronic components. However, the existing sealing method makes the inner space of the outer cases disconnected from the external environment. When the pressure or the temperature of the external environment changes, the air pressure inside the electronic products cannot be adjusted through the gaps hence easily leading to the deformation of the outer cases, or even causing the closed structures to be ruptured and ineffective.

SUMMARY

The disclosure provides a waterproof electronic device, which adopts a one-way valve to communicate with an external environment to achieve a one-way flow of a fluid, so as to avoid the deformation of the waterproof electronic device caused by the change of the pressure or temperature from the external environment.

The waterproof electronic device of the disclosure includes a body, a one-way valve, and a cover. The body has a first hole and a chamber, and the first hole penetrates the body and communicates with an external environment. The one-way valve is disposed on an inner surface of the body, and the one-way valve communicates with the first hole. The one-way valve has a main runner, multiple shunt runners, and multiple stopper blocks, and each stopper block is located between the main runner and a corresponding shunt runner. The cover is disposed on the one-way valve and the cover has a second hole, and the second hole communicates with the one-way valve and the chamber. When a fluid enters the one-way valve from the second hole, the fluid is discharged from the body through the first hole, and when the fluid enters the one-way valve from the first hole, the fluid generates a resistance in the one-way valve.

In an embodiment of the disclosure, the above-mentioned one-way valve is a Tesla valve.

In an embodiment of the disclosure, when the fluid enters the one-way valve from the second hole, the fluid is guided by each stopper block, flows into the main runner and the corresponding shunt runner, and is shunted into a first fluid and a second fluid. The first fluid and the second fluid converge in the main runner after passing through a corresponding stopper block.

In an embodiment of the disclosure, when the fluid enters the one-way valve from the first hole, the fluid is guided by each stopper block, flows into the main runner and the corresponding shunt runner, and is shunted into a first fluid and a second fluid. The second fluid generates a whirlpool in the main runner after passing through the corresponding stopper block.

In an embodiment of the disclosure, there is a vertical distance and a horizontal distance between the multiple adjacent stopper blocks.

In an embodiment of the disclosure, each of the above-mentioned stopper blocks has a flat surface and a curved surface. The flat surface is parallel to the main runner, and the curved surface is parallel to the corresponding shunt runner.

In an embodiment of the disclosure, the above-mentioned body includes a first case and a second case, and the second case is disposed with the first case so as to jointly form the chamber.

In an embodiment of the disclosure, the above-mentioned first case has a groove and a permeable film. The groove is disposed on an outer surface of the first case and communicates with the first hole, and the permeable film is disposed in the groove so as to cover the first hole.

In an embodiment of the disclosure, the above-mentioned multiple stopper blocks are staggeredly distributed along the main runner of the one-way valve.

Based on the above, the waterproof electronic device of the disclosure adopts a one-way valve. When the pressure or temperature from the external environment changes, the air in the chamber can flow to the external environment through the one-way valve to achieve the purpose of air pressure adjustment and avoid the deformation and damage of the waterproof electronic device due to the difference in the internal pressure and the external pressure.

Furthermore, when the fluid from the external environment flows into the one-way valve at a high speed, the fluid generates the resistance in the one-way valve, preventing the high-speed fluid from entering the chamber through the one-way valve, and thus achieving an airtight effect of dustproof and waterproof.

DESCRIPTION OF THE EMBODIMENTS

Figure 1:
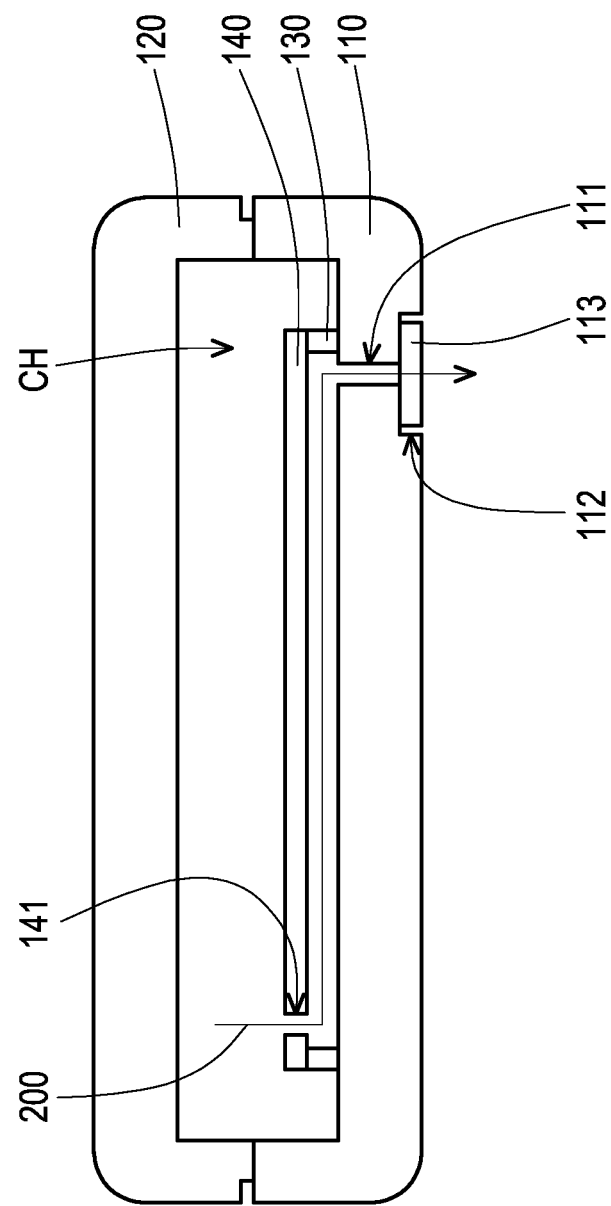
FIG. 1 is a plan view of a waterproof electronic device according to an embodiment of the disclosure.
Figure 2:
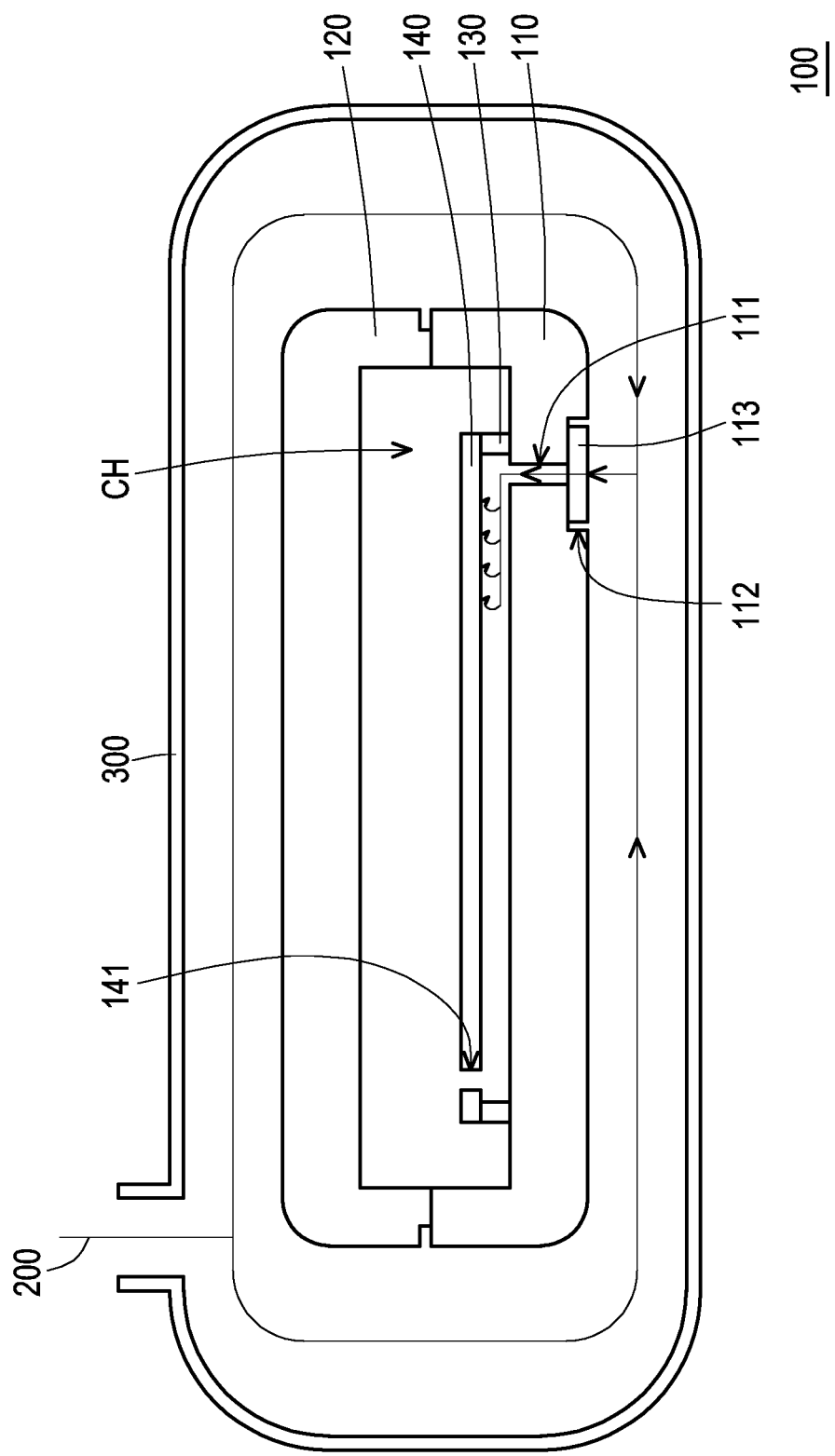
FIG. 2 is a plan view of the waterproof electronic device in FIG. 1 undergoing an airtight test.
Figure 3:
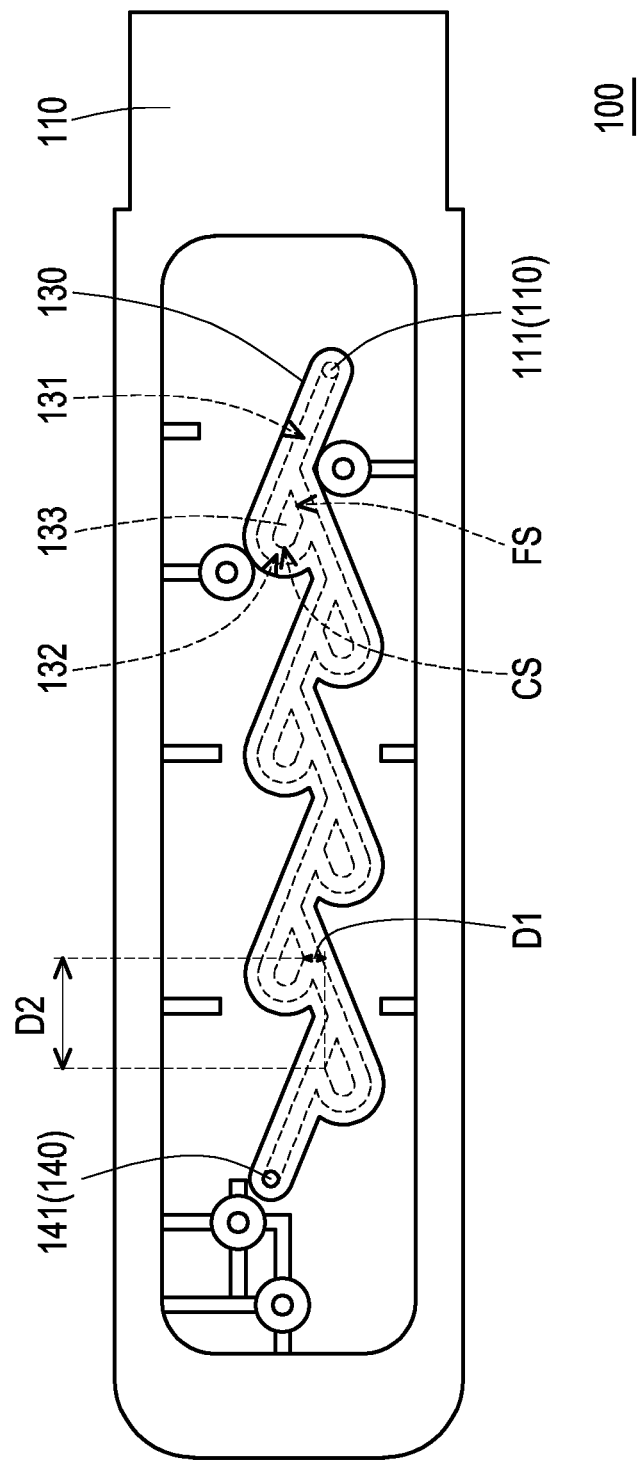
FIG. 3 is a top plan view of a one-way valve and a body of the waterproof electronic device in FIG. 1.
Figure 4:
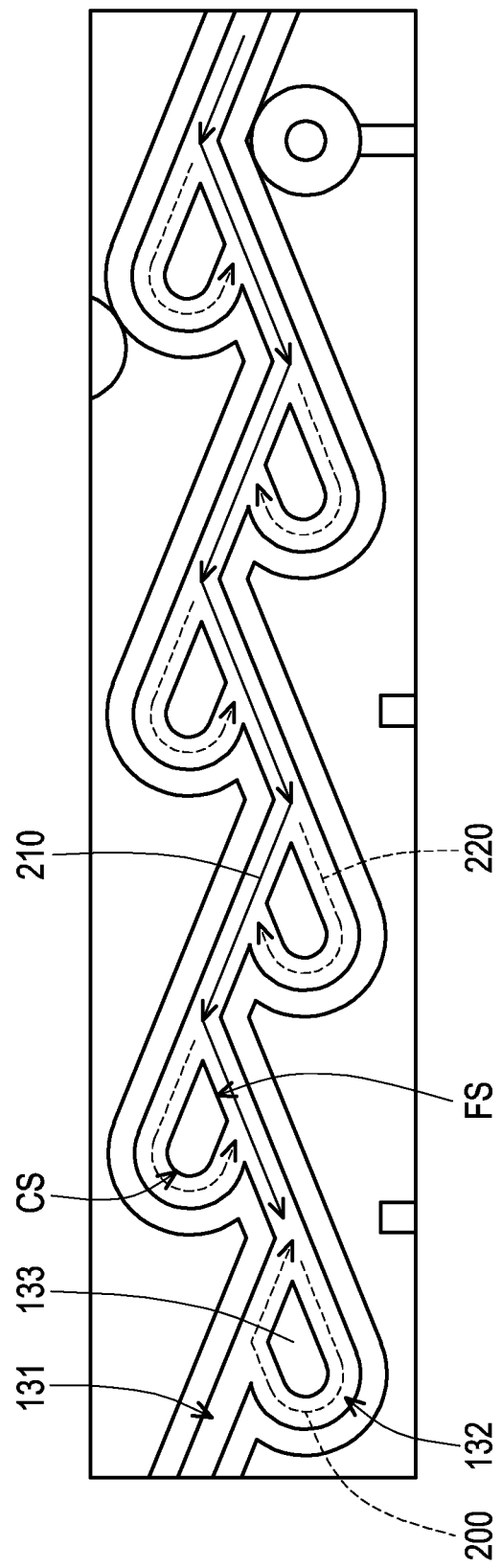
FIG. 4 is a schematic view of a flow of a fluid passing through the one-way valve in FIG. 3.
Figure 5:
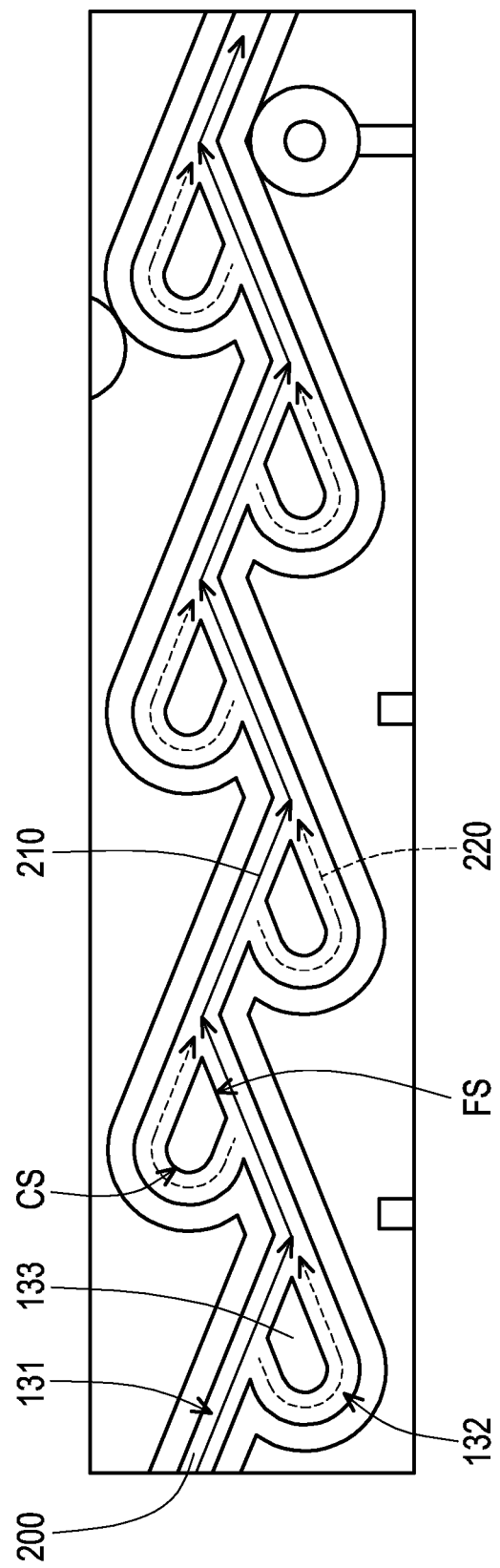
FIG. 5 is a schematic view of a flow of a fluid stopped by the one-way valve in FIG. 3.

FIG. 1 is a plan view of a waterproof electronic device according to an embodiment of the disclosure. FIG. 2 is a plan view of the waterproof electronic device in FIG. 1 undergoing an airtight test. FIG. 3 is a top plan view of a one-way valve and a body of the waterproof electronic device in FIG. 1. FIG. 4 is a schematic view of a flow of a fluid passing through the one-way valve in FIG. 3. FIG. 5 is a schematic view of a flow of a fluid stopped by the one-way valve in FIG. 3.

Referring to FIG. 1, a waterproof electronic device 100 of the disclosure is, for example, a smart phone, a tablet computer or other similar electronic products. Specifically, the waterproof electronic device 100 includes a body, a one-way valve 130, and a cover 140.

Referring to FIG. 1 to FIG. 3, the body has a first hole 111 and a chamber CH, and the first hole 111 penetrates an inner surface and an outer surface of the body and communicates with the external environment. The body includes a first case 110 and a second case 120, and the second case 120 is disposed with the first case 110 so as to jointly form the chamber CH. The chamber CH is used to place various electronic components. As a side note, the second case 120 and the first case 110 are connected to each other by gluing or adhering, so that the second case 120 and the first case 110 form an airtight structure.

The one-way valve 130 is disposed on the inner surface of the first case 110 of the body, and the one-way valve 130 is integrally formed on the inner surface of the first case 110 of the body. Additionally, the one-way valve 130 communicates with the first hole 111 of the first case 110 of the body. The cover 140 is disposed on the top of the one-way valve 130 and the cover 140 has a second hole 141, and the second hole 141 communicates with the one-way valve 130 and the chamber CH. Here, air or moisture in the chamber CH can flow out of the first case 110 of the body through the second hole 141, the one-way valve 130, and the first hole 111.

Referring to FIG. 1, when a fluid 200 (the air or moisture) in the chamber CH enters the one-way valve 130 from the second hole 141, the fluid 200 is discharged from the first case 110 of the body through the first hole 111. Here, when an air pressure in the chamber CH is higher than an air pressure from the external environment, then the air in the chamber CH is discharged through the one-way valve 130 so as to achieve a balance between the internal and external air pressures and avoid a deformation of the first case 110 and the second case 120 due to a difference in an internal pressure and an external pressure. Referring to FIG. 2, in a pressurization test of the waterproof electronic device 100, the waterproof electronic device 100 is placed in an airtight jig 300, and a high-speed pressurized fluid 200 is introduced. When the fluid 200 enters the one-way valve 130 from the first hole 111 of the first case 110, the fluid 200 generates a resistance in the one-way valve 130, thereby preventing the high-speed pressurized fluid 200 from entering the chamber CH, so as to achieve airtight requirements of dustproof and waterproof.

Referring to FIG. 3, the one-way valve 130 is a Tesla valve and the one-way valve 130 has a main runner 131, multiple shunt runners 132, and multiple stopper blocks 133. Each stopper block 133 is located between the main runner 131 and a corresponding shunt runner 132. In detail, there is a vertical distance D1 and a horizontal distance D2 between the multiple adjacent stopper blocks 133, that is, the multiple stopper blocks 133 are staggeredly distributed along the main runner of the one-way valve 130. Each stopper block 133 has a flat surface FS and a curved surface CS. The flat surface FS is parallel to the main runner 131, and the curved surface CS is parallel to the corresponding shunt runner 132.

Referring to FIG. 1 and FIG. 5, when the fluid 200 in the chamber CH enters the one-way valve 130 from the second hole 141, the fluid 200 is guided by each stopper block 133 and flows into the main runner 131 and the corresponding shunt runner 132, and is shunted into a first fluid 210 and a second fluid 220. The first fluid 210 flows along the flat surface FS, and the second fluid 220 flows along the curved surface CS. After the first fluid 210 and the second fluid 220 passing through a corresponding stopper blocks 133, the first fluid 210 and the second fluid 220 converge in the main runner 131. The fluid 200 after convergence passes through several stopper blocks 133 in the rear sequentially and repeats shunting and converging. Since a flow direction of the first fluid 210 and the second fluid 220 remains unchanged after being shunted, there will be no hindrance during convergence of the first fluid 210 and the second fluid 220, so that the fluid 200 can pass through the one-way valve 130 smoothly and be discharged from the first hole 111.

Referring to FIG. 2 and FIG. 4, when the external fluid 200 enters the one-way valve 130 from the first hole 111, the fluid 200 is guided by each stopper block 133 and flows into the main runner 131 and the corresponding shunt runner 132 respectively, and is shunted into a first fluid 210 and a second fluid 220. The first fluid 210 flows along the flat surface FS, and the second fluid 220 flows along the curved surface CS. After the first fluid 210 and the second fluid 220 passing through the corresponding stopper block 133, the first fluid 210 and the second fluid 220 collide with each other and converge in the main runner 131, so that the second fluid 220 generates a whirlpool in the main runner 131 after passing through the corresponding stopper block 133, and the fluid 200 loses flow energy after passing through each stopper block 133.

As the number of stopper blocks 133 passed through by the fluid 200 increases, the resistance experienced by the fluid 200 in the one-way valve 130 increases accordingly, thereby achieving the purpose of a one-way communication. As a side note, the one-way valve 130 in this case is suitable for the high-speed fluid 200. When the flow velocity exceeds a threshold value, the resistance of the fluid 200 entering the one-way valve 130 from the first hole 111 increases accordingly.

Referring to FIG. 1 and FIG. 2, the first case 110 has a groove 112 and a permeable film 113. The groove 112 is disposed on the outer surface of the first case 110 and communicates with the first hole 111, and the permeable film 113 is disposed in the groove 112 so as to cover the first hole 111. The permeable film 113 is used to prevent a low-velocity fluid 200 from the external environment from entering the chamber CH through the first hole 111. As a side note, when the flow velocity of the fluid 200 is relatively slow, the resistance provided by the one-way valve 130 is small, so the fluid 200 pass through the one-way valve 130 normally either from the first hole 111 or the second hole 141. Therefore, through the disposition of the permeable film 113, the waterproof electronic device 100 has an effect of dustproof and waterproof under normal environment.

In summary, the waterproof electronic device of the disclosure adopts a one-way valve. When the pressure or temperature from the external environment changes, the air in the chamber can flow to the external environment through the one-way valve to achieve the purpose of air pressure adjustment and avoid the deformation and damage of the waterproof electronic device due to the difference in the internal pressure and the external pressure.

Furthermore, when the fluid from the external environment flows into the one-way valve at a high speed, the fluid generates the resistance in the one-way valve, preventing the high-speed fluid from entering the chamber through the one-way valve, and thus achieving an airtight effect of dustproof and waterproof

What is claimed is:

1. A waterproof electronic device, comprising:
a body comprising a first hole and a chamber, wherein the first hole penetrates the body and communicates with an external environment;
a one-way valve disposed on an inner surface of the body, wherein the one-way valve communicates with the first hole; and the one-way valve has a main runner, a plurality of shunt runners, and a plurality of stopper blocks, wherein each of the stopper blocks is located between the main runner and the corresponding shunt runner; and
a cover disposed on the one-way valve, wherein the cover comprises a second hole, wherein the second hole communicates with the one-way valve and the chamber,
wherein, in response to a fluid entering the one-way valve from the second hole, the fluid is discharged from the body through the first hole, and in response to the fluid entering the one-way valve from the first hole, the fluid generates a resistance in the one-way valve.

2. The waterproof electronic device as claimed in claim 1, wherein the one-way valve is a Tesla valve.

3. The waterproof electronic device as claimed in claim 2, wherein in response to the fluid entering the one-way valve from the second hole, the fluid is guided by each of the stopper blocks, flows into the main runner and the corresponding shunt runner, and is shunted into a first fluid and a second fluid, wherein the first fluid and the second fluid converge in the main runner after passing through the corresponding stopper block.

4. The waterproof electronic device as claimed in claim 2, wherein in response to the fluid entering the one-way valve from the first hole and a flow velocity of the fluid being greater than a threshold value, the fluid is guided by each of the stopper blocks, flows into the main runner and the corresponding shunt runner, and is shunted into a first fluid and a second fluid, wherein the second fluid generates a whirlpool in the main runner after passing through the corresponding stopper block.

5. The waterproof electronic device as claimed in claim 2, wherein there is a vertical distance and a horizontal distance between the adjacent stopper blocks.

6. The waterproof electronic device as claimed in claim 2, wherein each of the stopper blocks has a flat surface and a curved surface, wherein the flat surface is parallel to the main runner, and the curved surface is parallel to the corresponding shunt runner.

7. The waterproof electronic device as claimed in claim 1, wherein the body comprises a first case and a second case, wherein the second case is disposed on the first case so as to jointly form the chamber.

8. The waterproof electronic device as claimed in claim 7, wherein the first case has a groove and a permeable film, wherein the groove is disposed on an outer surface of the first case and communicates with the first hole; and the permeable film is disposed in the groove so as to cover the first hole.

9. The waterproof electronic device as claimed in claim 1, wherein the plurality of stopper blocks are staggeredly distributed along the main runner of the one-way valve.

\* \* \* \* \*